(12) United States Patent
Nakagawa

(10) Patent No.: US 6,512,180 B2
(45) Date of Patent: Jan. 28, 2003

(54) PRINTED-WIRING BOARD, METHOD FOR IDENTIFYING SAME, AND METHOD FOR MANUFACTURING SAME

(75) Inventor: Hisatsuna Nakagawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/005,158

(22) Filed: Dec. 7, 2001

(65) Prior Publication Data

US 2003/0000734 A1 Jan. 2, 2003

(30) Foreign Application Priority Data

Jun. 29, 2001 (JP) .................................... 2001-198126

(51) Int. Cl.[7] ................................................ H05K 1/02
(52) U.S. Cl. ...................... 174/250; 257/786; 361/774; 361/777
(58) Field of Search ................... 174/250, 261, 174/255; 361/767, 774, 777; 257/786

(56) References Cited

U.S. PATENT DOCUMENTS

| | | | | | |
|---|---|---|---|---|---|
| 4,489,365 | A | * | 12/1984 | Daberkoe | 361/777 |
| 5,913,688 | A | * | 6/1999 | Marion | 439/76.1 |
| 6,286,616 | B1 | * | 7/2001 | Kamekawa | 257/786 |
| 6,330,635 | B1 | * | 12/2001 | Stafford | 711/103 |

FOREIGN PATENT DOCUMENTS

| | | |
|---|---|---|
| JP | 51-25761 | 2/1976 |
| JP | 6-112603 | 4/1994 |
| JP | 6-296065 | 10/1994 |

* cited by examiner

Primary Examiner—Albert W. Paladini
(74) Attorney, Agent, or Firm—Staas & Halsey LLP

(57) ABSTRACT

A printed-wiring board to be mounted with a circuit element includes a plurality of pads which assist in an electric connection between the circuit element and a wiring pattern, at least one of said plurality of pads being used to serve as an identifier for identifying the printed-wiring board.

20 Claims, 11 Drawing Sheets

| NO. | COORDINATE (X, Y) | DRAWING NO. |
|---|---|---|
| 1 | (-14.2, -14.4) | AAA-AAAAAAA |
| 2 | (-17.1, -18.5) | BBB-AAAAAAA |
| 3 | (-13.7, -15.8) | ⋮ |
| 4 | (-15.6, -17.3) | ⋮ |
| 5 | (-18.2, -19.5) | ⋮ |
| 6 | (-14.4, -12.7) | ⋮ |
| 7 | (-15.2, -17.6) | ⋮ |
| 8 | (-19.1, -18.8) | ⋮ |
| 9 | (-14.3, -14.2) | ⋮ |
| 10 | (-17.7, -15.4) | ⋮ |
| 11 | (-15.6, -14.3) | ⋮ |
| 12 | (-17.1, -15.6) | ⋮ |
| 13 | (-14.2, -17.6) | CCC-AAAAAAA |
| ⋮ | ⋮ | ⋮ |
| 78 | (-15.2, -17.8) | ⋮ |
| 79 | (-15.5, -17.3) | ⋮ |
| 80 | (-19.5, -18.6) | ⋮ |
| 81 | (-12.2, -13.3) | ⋮ |
| 82 | (-14.1, -11.5) | ⋮ |
| 83 | (-16.4, -16.6) | ⋮ |
| 84 | (-15.3, -14.6) | ⋮ |
| 85 | (-17.0, -16.1) | ⋮ |
| 86 | (-18.8, -19.0) | ⋮ |
| 87 | (-14.2, -17.4) | ⋮ |
| 88 | (-14.3, -15.6) | ⋮ |
| 89 | (-17.2, -18.8) | ⋮ |
| 90 | (-17.8, -19.3) | ⋮ |

FIG. 2

PRINTED-WIRING BOARD, METHOD FOR IDENTIFYING SAME, AND METHOD FOR MANUFACTURING SAME

BACKGROUND OF THE INVENTION

The present invention relates generally to printed-wiring board mounted onto electronic devices, such as personal computers (hereinafter referred to as "PCs"), and more particularly to a method for identifying the printed-wiring board. The printed-wiring board to which the present invention is applicable covers a broad range of printed-wiring boards, such as those to be mounted onto a PC, a cellular phone and other electronic devices.

Along with the recent technology development, electronic devices, such as PCs and cellular phones, have become increasingly smaller and adopted more diversified designs. Accordingly, a wide variety of shapes of circuit boards have also been used from motherboards to be mounted onto PCs and cellular phones to package circuits (sometimes referred to as a Chip Sized Packages ("CSPs"). These printed-wiring boards (referred to as a "board" hereinafter unless otherwise specified) include a conductive part, such as a wiring pattern, and the conductive part includes a plurality of fine pads which assist in an electric connection between terminals of a circuit element, such as a semiconductor chip, and the wiring pattern.

Some manufactures produce such printed-wiring boards by themselves, while others are supplied with these printed-wiring boards from one or more vendors. Generally, in requesting a third party to manufacture the above printed-wiring boards, a PC manufacturer, for example, provides its vendor with a schematic blueprint of the board as manufacturing data readable with a CAD/CAM, and requests the vendor to deliver the boards. In response, the vendor processes and modifies the manufacturing data such that the vendor may actually produce the board, and then submits the modified data to the manufacturer for permission, after putting down ID data (referred to as an "identifier" hereinafter), such as an alphanumeric character, onto an insulating part on the board.

The identifier is usually expressed, for example, through etched and cutout letters in a conductive layer closest to the board surface, a marking process using ink onto the board surface, and a stamp process. Any of these methods may visualize the identifier for microscopic test.

However, as the recent reduced board size and wiring high-density progress, it often becomes difficult to indicate the identifier on the board. For example, in a CSP as a typical example, the reduced board size and wiring high-density narrow a space for the identifier made of marked, stamped, and etched or cutout letters. On the other hand, even when there is a space enough for the identifier, some PC manufacturers often refuse the insertion of the identifier to keep board's external appearance. For example, a certain PC manufacturer uses some vendors, and prefers the same external appearances for all the boards delivered from these vendors; for this reason, the PC manufacturer does not like to allow these vendors to indicate their unique identifiers.

The PC manufacturer performs an acceptance test for boards delivered from the vendor, and returns to them those boards which have been determined as inferior products. The vendor then attempts to investigate the cause and state of any returned, inferior board, but could not if the board does not have any identifier that enables the vendor to find out board's manufacture date, shipping date, type, etc. Therefore, there has been a demand to provide a board with an identifier.

As an identification approach without greatly marring board's external appearance, Japanese Laid-Open Patent Application No. 6-296065 proposes putting an identifier onto board's disused board part located around and cut down from a product part that is used as a finished product. Nevertheless, the method according to this reference cannot neither identify the product part that has been separated from the disused board part, nor investigate the inferior products. Japanese Laid-Open Patent Application No. 6-112603, on the other hand, proposes identifying a board by forming a plurality holes in the insulating part instead of using alphanumerical characters, and by opening and closing each of them. However, it is still unlikely to obtain permission from a manufacturer since this reference uses the same approach as the prior art in forming an identifier in board's non-conductive portion, and it expensively requires a special machine to form and read these holes.

BRIEF SUMMARY OF THE INVENTION

Accordingly, it is an exemplified object of the present invention to provide a method for identifying a printed-wiring board without marring board's external appearance, a printed-wiring board treated by this identifying method, and a method for manufacturing such a printed-wiring board.

In order to achieve the above objects, a printed-wiring board of one aspect according to the present invention to be mounted with a circuit element includes a plurality of pads which assist in an electric connection between the circuit element and a wiring pattern, at least one of the plurality of pads being used to serve as an identifier for identifying the printed-wiring board. This printed-wiring board uses pads originally provided to the printed-wiring board to identify the printed-wiring board. In addition, it may identify the product part since it is mounted with the circuit element, such as a semiconductor chip. A print board module including the printed-wiring board mounted with the circuit element and an electronic device, such as a PC, having such a print board module exhibit similar operations.

The plurality of pads may include a first pad to be mounted with the circuit element, and unobservable after the circuit element is mounted thereto, and a second pad not to be mounted with the circuit element, the identifier being determined based on a position of the second pad. Use of the position of the second pad that is not to be mounted with the circuit element to indicate the identifier does not require the circuit element to be removed from the printed-wiring board but enables the printed-wiring board to be identified with the circuit element mounted onto the printed-wiring board. This second pad may be called a dummy pad.

The plurality of pads include a pad having a first shape, and a pad being located at a specific position and having a second shape different from the first shape, and wherein the identifier is determined based on the specific position and/or the second shape. This printed-wiring board changes pad's shape and are identifiable based on the specific position or the second shape. The position of the pad is, for example, a coordinate position from a preset origin, while the shape of the pad is, for example, a circle. Here, "based on" includes derivatives of the position and/or the second shape, such as a position determined by the specific position, e.g., a position next to or above the specific position. The first and second shapes are, for example, a circle, a rectangle, a pentagon, a hexagon, an octagon, and a cross.

At least one of the plurality of pads are provided with and protected by a protective mask that has an opening smaller than a contour of at least one of the plurality of pads, through which opening the circuit element is electrically connectible to at least one of the plurality of pads. This printed-wiring board sets the second shape to the pad provided with the protective mask, such as a SMD (Solder Mask Definition) pad, and maintains the stable electric connection between the circuit element and the pad unless a shape of the opening is changed in the protective mask on the pad. This aspect of the present invention is preferable, for example, to a change of a shape of a pad that has no protective mask, such as an NSMD or NON-Solder Mask Definition pad, since such a pad is expected to use its entire surface for electric connection with the circuit element and has already been designed to be optimal to the electric connection.

The plurality of pads may include a pad having a first shape, and a plurality of pads forming a specific design and each having a second shape different from the first shape, and wherein the identifier is determined based on the design. This printed-wiring board expresses the identifier using the design, e.g., a shape and/or position of the design expressed by the plural pads, and/or the second shape, instead of using alphabets and numerals put on the non-conductive part in the conventional printed-wiring board. The design may be provided in the above dummy and SMD pads.

The identifier may identify at least one piece of identification information including a drawing number that instructs a design drawing of the printed-wiring board, an inboard position number that instructs a position in a board at which the printed-wiring board is taken out, and a country of production, manufacturer, size, version, the number of layers, name, and date of manufacture of the printed-wiring board.

A contour of at least one of the plurality of pads is preferably larger than an area in which the circuit element contacts another pad, so as to maintain a good electric connection between the pad and the circuit element.

A method of another aspect according to the present invention for identifying a printed-wiring board including a plurality of pads adapted to assist in an electrical connection between a wiring pattern and an electronic element mounted onto the printed-wiring board includes the steps of selecting a specific position among the plurality of pads in the printed-wiring board, and setting the pad located at the specific position to a shape different from another pad at another position. This method also changes a shape of a pad that has been originally provided to the printed-wiring board to identify the printed-wiring board based on a position or shape of the pad.

The plurality of pads may include a first pad to be mounted with the circuit element and unobservable after the circuit element is mounted thereto, and a second pad not to be mounted with the circuit element, wherein the selecting step selects the specific position from the second pad. This method selects the second pad not to be mounted with the circuit element, such as a dummy pad, which will be described later, and enables the printed-wiring board to be identified without removing the circuit element from the printed-wiring board, i.e., while the printed-wiring board is mounted with the circuit element.

The selecting step may select the specific position from a pad provided with and protected by a protective mask that has an opening smaller than a contour of the pad provided with the protective mask, through which opening the circuit element is electrically connectible to the pad located at the specific position. The above pad is, for example, a SMD (Solder Mask Definition) pad. This method has an advantage in that the circuit element and the pad are stably connected unless a shape of the opening is changed in the protective mask above the pad. This aspect of the present invention is preferable, for example, to a change of a shape of a pad that has no protective mask, such as an NSMD or NON-Solder Mask Definition pad, since such a pad is expected to use its entire surface for electric connection with the circuit element and has already been designed optimal to the electric connection.

A method of still another aspect according to the present invention for identifying a printed-wiring board including a plurality of pads adapted to assist in an electrical connection between a wiring pattern and an electronic element mounted onto the printed-wiring board, the plurality of pads including a pad having a first shape and a pad being located at a specific position and having a second shape different from the first shape includes the steps of obtaining information of the specific position or the second shape in the printed-wiring board, and identifying a management item for the printed-wiring board by referring to a table that has been prepared in advance and correlates the information with the management item. This method also exhibits operations similar to the above method. The information of the specific position or the second shape covers, as mentioned above, the specific position itself and a position determined by the specific position, such as a position next to the specific position.

As discussed above, the above identifying method may determine the identifier based on the design assigned to one or more different shaped pads. More specifically, the identifier in this case is determined by a shape and/or position of the design, and/or pad's shape. The design may be provided in the above dummy and SMD pads.

A method according to the present invention for manufacturing an identifiable printed-wiring board including a plurality of pads adapted to assist in an electrical connection between a wiring pattern and an electronic element mounted onto the printed-wiring board includes the steps of setting a pad at a specific position in the plurality of pads to a specific shape different from another pad at another position so as to identify the printed-wiring board, and making the plurality of pads through an etching process. This method is for manufacturing the identifiable printed-wiring board based on the specific position or shape, and exhibits the aforementioned operations.

Other objects and further features of the present invention will become readily apparent from the following description of the embodiments with reference to accompanying drawings.

BRIEF DESCRIPTION OF THE DRAWINGS

FIG. 2 is an exemplary correspondence table between identification information positional information for the printed-wiring board shown in FIG. 1.

DETAILED DESCRIPTION OF THE INVENTION

Figure 1:
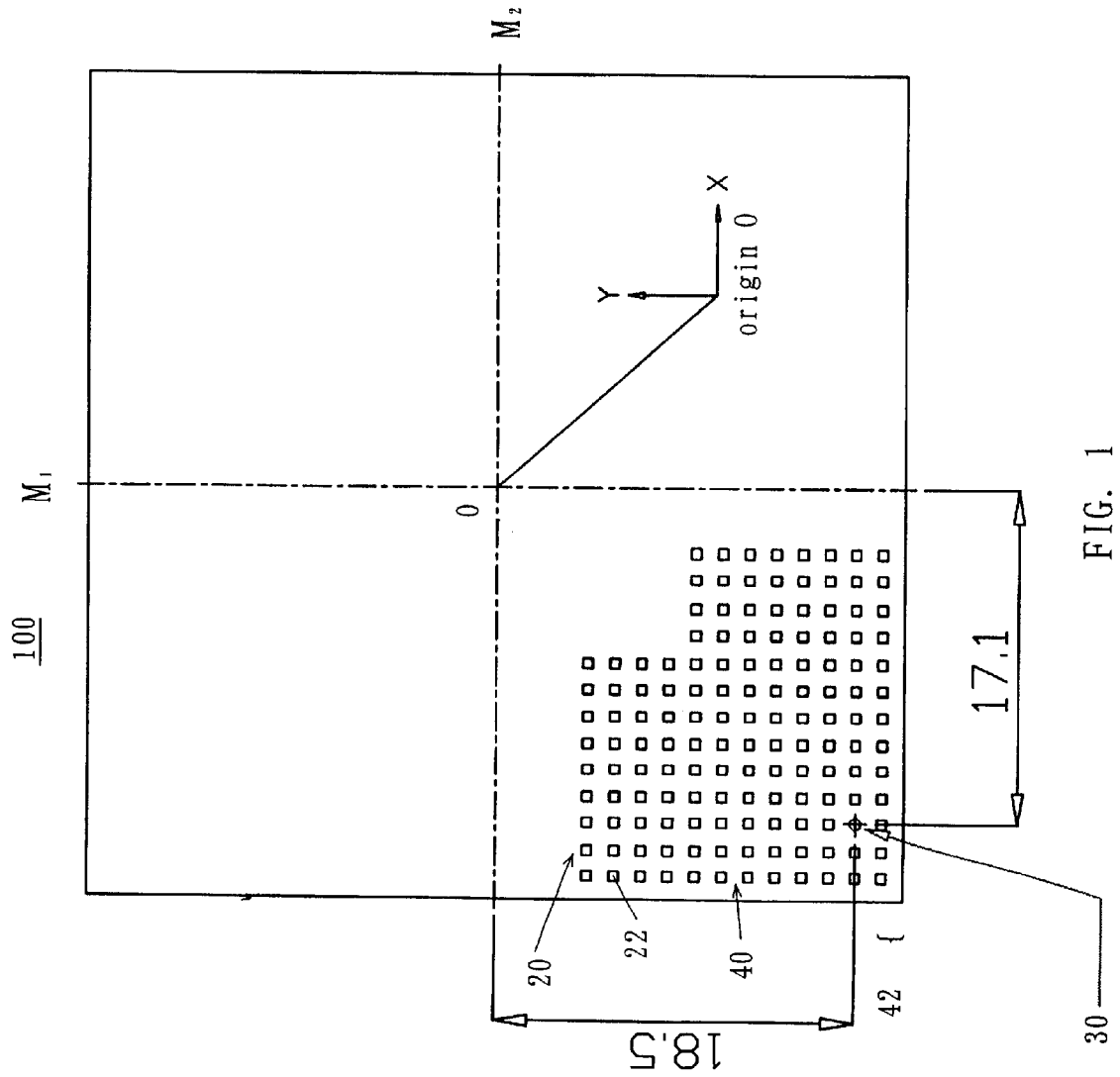
FIG. 1 is a schematic plane view of a printed-wiring board according to the present invention.

Referring now to the accompanying drawings, a description will be given of printed-wiring board 100 of the present invention. The printed-wiring board 100 includes, as shown in FIG. 1, a conductive part 20 and a non-conductive or insulating part 40. Here, FIG. 1 is a schematic plane view of the printed-wiring board 100. The conductive part 20 is the aggregate of a plurality of pads 22, arranged in a preset interval longitudinally and laterally in this embodiment, but the present invention is not limited to this arrangement. In FIG. 1, the printed-wiring board 100 is divided into four parts and the conductive part 20 is partially indicated in the lower left part.

Figure 14:
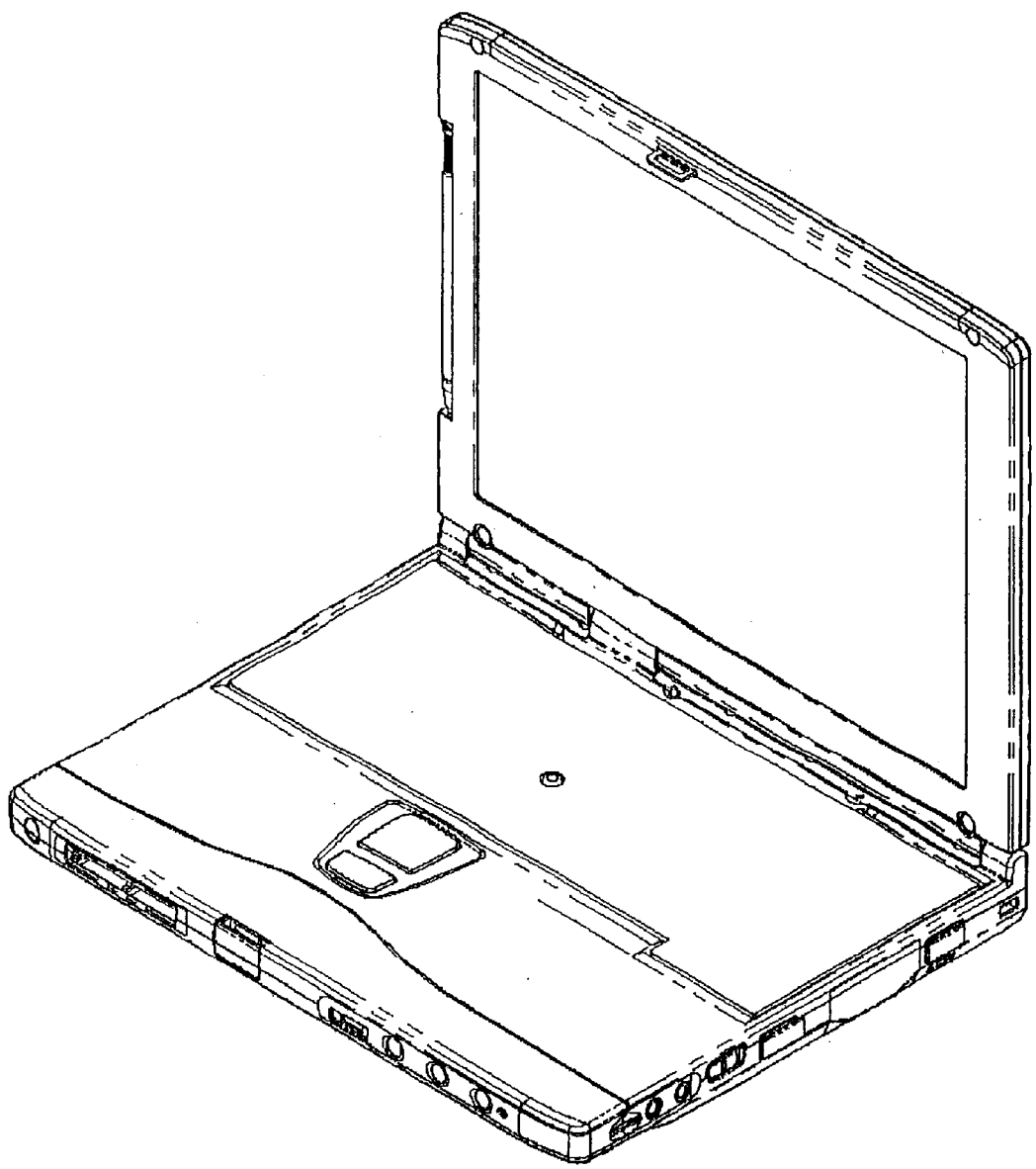
FIG. 14 is a perspective view of an external view of an exemplary electronic device to which the printed-wiring board of the present invention is applicable.

The printed-wiring board 100 may be referred to as a package board or a CSP. The printed-wiring board 100 in this embodiment has a square shape, but this shape may be appropriately modified depending upon a shape of the circuit element to be mounted onto the printed-wiring board 100, and an electronic device to be mounted with the printed-wiring board 100. The electronic element includes, for example, a semiconductor chip, while the electronic device includes, for example, a PC 1 shown in FIG. 14 and a cellular phone. Here, FIG. 14 is a perspective view of an external appearance of a PC as an exemplary electronic device to which the printed-wiring board 100 is applicable. This embodiment sets an X-Y coordinate and its origin O at a center position by dividing the printed-wiring board 100 into four parts using two centerlines $M_1$ and $M_2$, where these positions of X-Y coordinate and its origin are for exemplary purposes. The printed-wiring board 100 is a product part or version to be mounted with the circuit element. However, the present invention does not exclude its application to a disused part as well that serves as a part to be cut down from the product part at the time of completion.

The conductive part 20 includes a plurality of pads 22 designed and arranged to fit the circuit element to be mounted. The pad 22 serves to assist in an electric connection between a terminal of the circuit element to be mounted onto the printed-wiring board 100 and a wiring pattern in the printed-wiring board 100 or a printed-wiring board to be mounted with the printed-wiring board 100. The pad 22 is shaped like, but not limited to, a square. The conductive part 20 is made of highly conductive metal, such as cupper. The conductive part 20 further includes a pad 30, which will be described later.

The printed-wiring board 100 includes an identifier for identifying the printed-wiring board 100. The conductive part 20 includes, at a position (X, Y)=(−17.1, −18.5), the pad 30 having a circular shape different from the square shape of the pad 22. The identifier is determined based on a position and/or shape of the pad 30. The position of the pad 30 is (X, Y)=(−17.1, −18.5) in this embodiment. The shape of the pad 30 is a circular shape in this embodiment. Hereupon, "based on a position and/or shape" means, as discussed later with reference to FIG. 3, to include not only the position and/or shape themselves but also their derivatives, such as a position next to the position of the pad 30.

FIG. 2 shows a correspondence table that manages a drawing number which the identifier identifies. The correspondence table contains serial numbers, coordinates (X, Y) from the origin O, drawing numbers that instruct design drawings of the printed-wiring boards 100. The serial numbers may be replaced by alphabets and other symbols.

A serial number 1 corresponds to a coordinate (X, Y)=(−14.2, −14.4) and a drawing number AAA-AAAAAAA. A serial number 13 corresponds to a coordinate (X, Y)=(−14.2, −17.6) and a drawing number CCC-AAAAAAA. It is understood that a coordinate (X, Y)=(−17.1, −18.5) and a drawing number BBB-AAAAAAA correspond to a serial number 2. "17.1" and "18.5" are each a management dimension value. A duplicative creation of the same coordinate for plural pads 30 for certain sized printed-wiring board 100 is prevented so that each coordinate identifies a unique identifier as the drawing number in this example. When the coordinate identifies an identifier that is not unique, such as a manufacturing country of the printed-wiring board 100, the same coordinate may be duplicated for plural pads 30 for certain sized printed-wiring board 100. The drawing number is usually provided as CAD/CAM data, and thus may be correlated with a directory name, folder name, file name and other information of the file that stores the data. The shape of the pad 30 is used to point out a position of the pad 30 in this embodiment, but the shape itself or a combination of the shape and the position may be used to identify a management item or an object to be identified, as will be discussed later. Where a position of the pad is fixed, for example, onto the lowest and leftmost pad in the printed-wiring board 100 in FIG. 1, the management item may be identified depending upon the shape of the pad 30: For example, it is made in Japan when the pad is shaped like a circle.

Of course, the pad 30 may be shaped like a rectangle, a pentagon, a hexagon, an octagon, a cross, and any other arbitrary form. In addition, the pad 30 may be regarded to have a different shape when its shape is the same as the pad 22 but rotated by a preset angle with respect to the centerline $M_1$ or $M_2$. For example, this is the case where the pad 30 is formed by rotating the pad 22 by 45 degrees as seen in pad 30A, which will be described later.

Since the pad 22 has a length and breadth with a dimension of about 0.5 mm×0.5 mm and the pad 30 has a diameter of about 0.5 mm, the pad 30 provokes no sense of incompatibility at sight. The printed-wiring board 100 is originally provided to the pads 22, and the pad 30 makes use of these pads 22 that are originally provided to the printed-wiring board 100. Therefore, the pad 30 has a better economical efficiency than a newly created pad for identification purposes. As a printed-wiring board has been used for a portable terminal, such as a cellular phone and a PDA and the miniaturization of such a portable terminal has progressed, the smaller printed-wiring board has been demanded. Thus, even when an indication of the ID data is permitted, the non-conductive part 40, such as the area 42, is physically too small to indicate the ID data. The present invention also solves this problem. In any event, the pad 30 does not mar the external appearance of the printed-wiring board 100.

The pad 30 is provided in the product part having the conductive part to be mounted with the circuit element, and thus the present invention enables to identify and track the product part even after the product part is cut down from the disused part.

Figure 3:
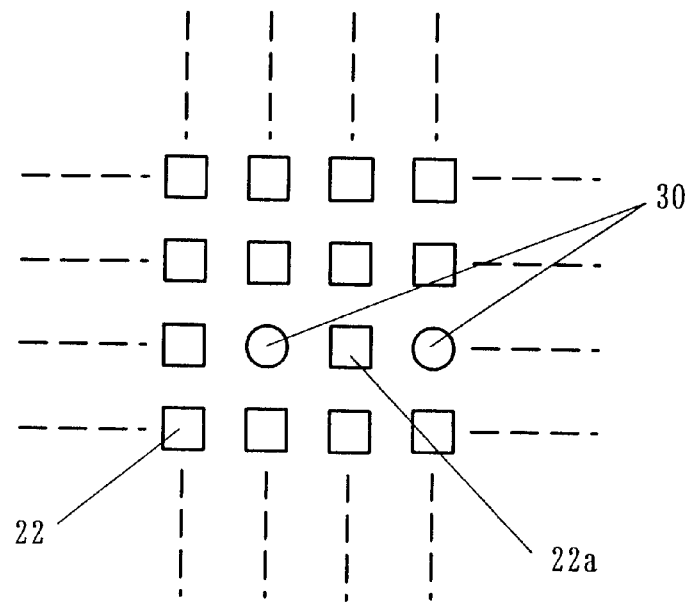
FIG. 3 is a partially enlarged plan view showing an exemplary modification of a conductive part in the printed-wiring board shown in FIG. 1.

Although the positional information of the pad 30 is used to identify the drawing number in this embodiment, the positional information of a pad determined by the pad 30 may be used, as described above. For example, as shown in FIG. 3, the positional information of a pad 22 (22a) sandwiched by two pads 30 may have an ID function. FIG. 3 is a partially enlarged plan view of a modification of FIG. 1. A pad determined by the pad 30 may be the pad 22 or pad 30. As shown in FIG. 3, the number of pads 30 is not limited to two. For example, three or more pads 30 may be employed to specify the pad 22a by replacing the pads 22 above, under, upper and lower left sides of, and upper and lower right sides of the pad 22a, with the pad 30. Alternatively, only one pad 30 may be provided under a given condition, for example, which uses a position of a pad apart by two blocks from the pad 30 to the right.

Figure 4:
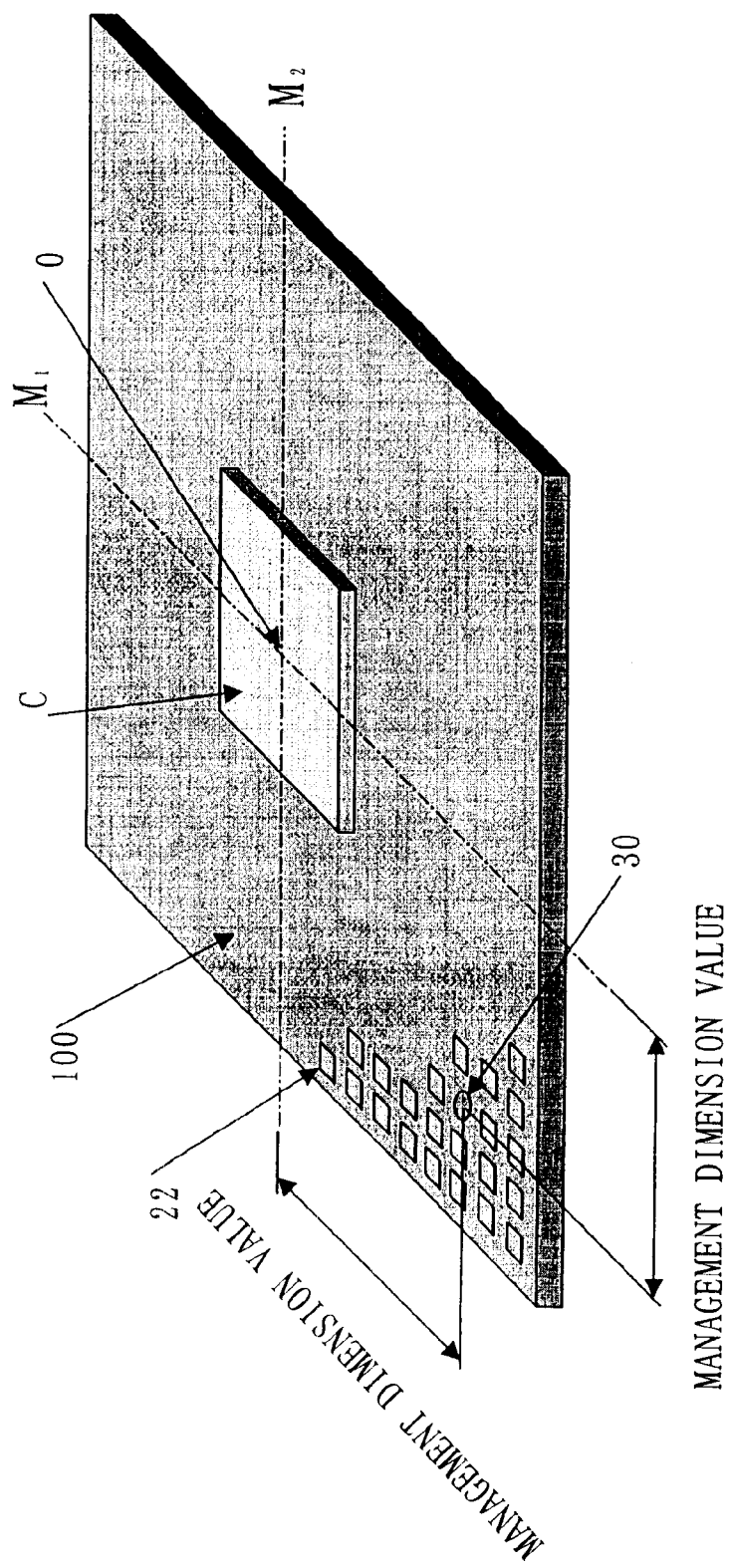
FIG. 4 is a schematic perspective view of a print board module that includes the printed-wiring board shown in FIG. 1 mounted with a circuit element.

Referring to FIG. 4, the conductive part 20 has an area to be mounted with a circuit element C, and an area not to be mounted with the circuit element C. The "area to be mounted with the circuit element C" is an area (not shown) located under the circuit element C, and unobservable from the outside after mounted with the circuit element C. The "area not to be mounted with the circuit element C" is an area outside the area to be mounted with the circuit element C. Here, FIG. 4 is a schematic perspective view of a print board module 2 that includes the printed-wiring board 100 shown in FIG. 1 mounted with the circuit element C. The print board module 2 is mounted into an electronic device, such as the PC 1 shown in FIG. 14.

The pad 30 is exemplarily located in the area not to be mounted with the circuit element C in this embodiment. Those pads in the area not to be mounted with the circuit element C are often called "dummy pads". The dummy pad serves to adjust a conductive area in each conductive layer and enhance the manufacturing efficiency in forming a wiring pattern. A shape of the dummy pad may be a circle, a rectangle, a cross and any other form. More specifically, suppose there are sparse and dense parts in the wiring pattern in the conductive layer. Then, in electroplating the pattern, the electroplating current concentrates onto the dense part, resulting in thick electroplated cupper, while in etching a pattern, the sparse conductive part is excessively etched. In order to eliminate these problems, the dummy pads are used to form the uniform conductive area and pattern distribution in each conductive layer.

When the pad 30 is selected from the area to be mounted with the circuit element C, the external appearance of the printed-wiring board 100 is advantageously not marred at all after the circuit element C is mounted, but the circuit element C would be arduously removed from the printed-wiring board 100 to find the identifier. Accordingly, the instant embodiment selects the pad 30 among dummy pads. This feature is greatly effective since the printed-wiring boards 100 are determined and returned as inferior products usually after the circuit element C is mounted, and the identification is particularly required.

The object to be identified or the management item using the identifier is not limited to the drawing number. For example, the identifier identifies at least one piece of identification information including an inboard position number that instructs a position in a board at which the printed-wiring board 100 is taken out, and a manufacturing country, a manufacturer, a size, the number of design versions, the number of layers, a name or development code, such as Pentium, and a date of manufacture of the printed-wiring board 100.

Figure 5:
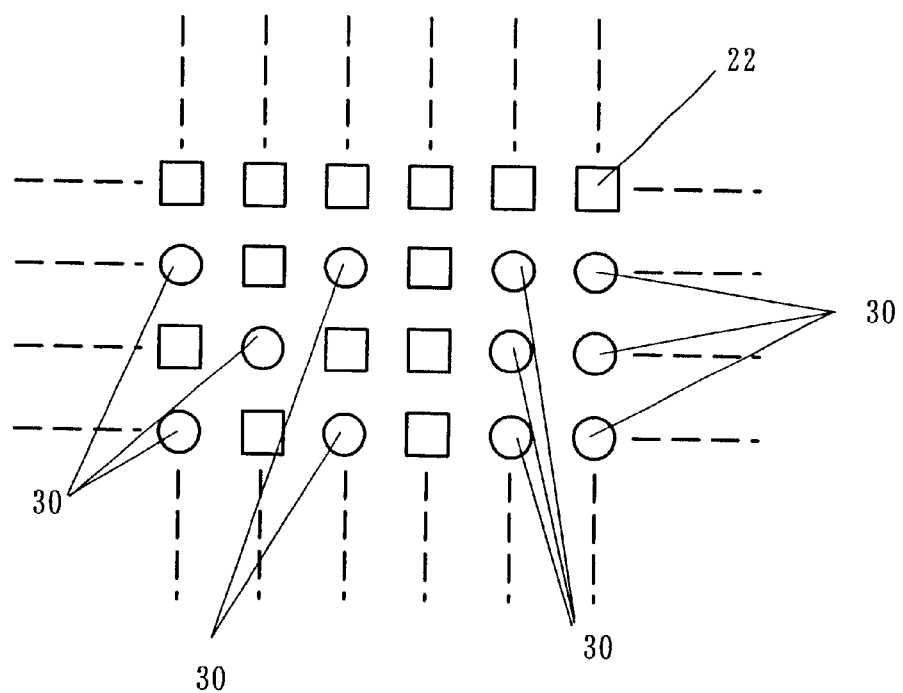
FIG. 5 is a partial enlarged view of another exemplary modification of a conductive part in the printed-wiring board shown in FIG. 1.

Any number of pads 30 may be used. In addition, each pad 30 may identify the object to be identified or a plurality of pads 30 cooperatively may identify one object t6 be identified. For example, as shown in FIG. 5, plural pads 30 indicate "X-II" . Here, FIG. 5 is a plane view showing an example where a plurality of pads 30 cooperatively identify one management item. In this case, a design formed by a plurality of pads 30 constitutes the identifier. Of course, different management items may be assigned to a position and/or shape of the design and a shape of each pad 30.

One or more pads 30 form a predetermined angle, and the angle information may form a parameter used for identification purposes.

Figure 6:
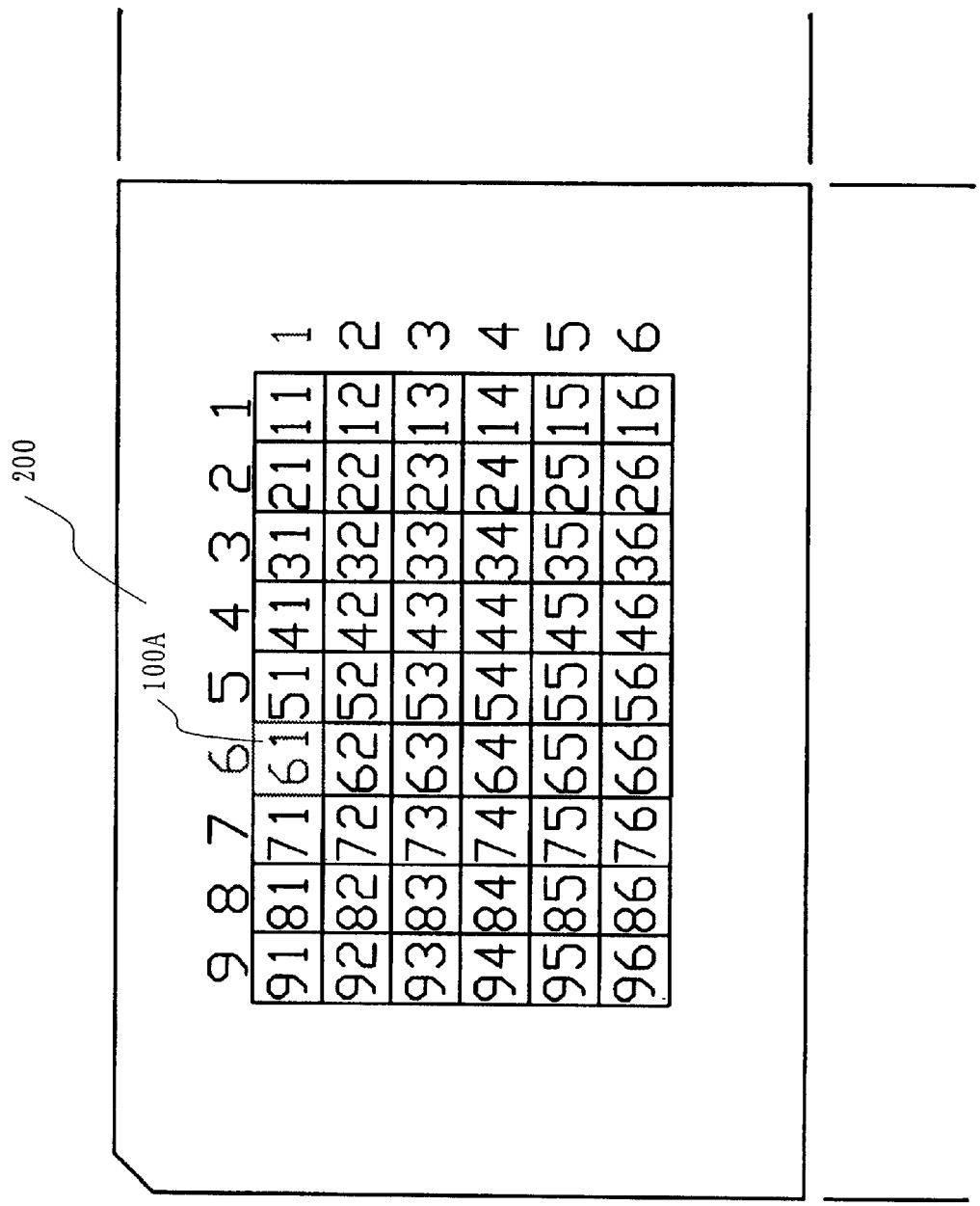
FIG. 6 is a schematic plane view of a board from which another printed-wiring board is taken out.
Figure 7:
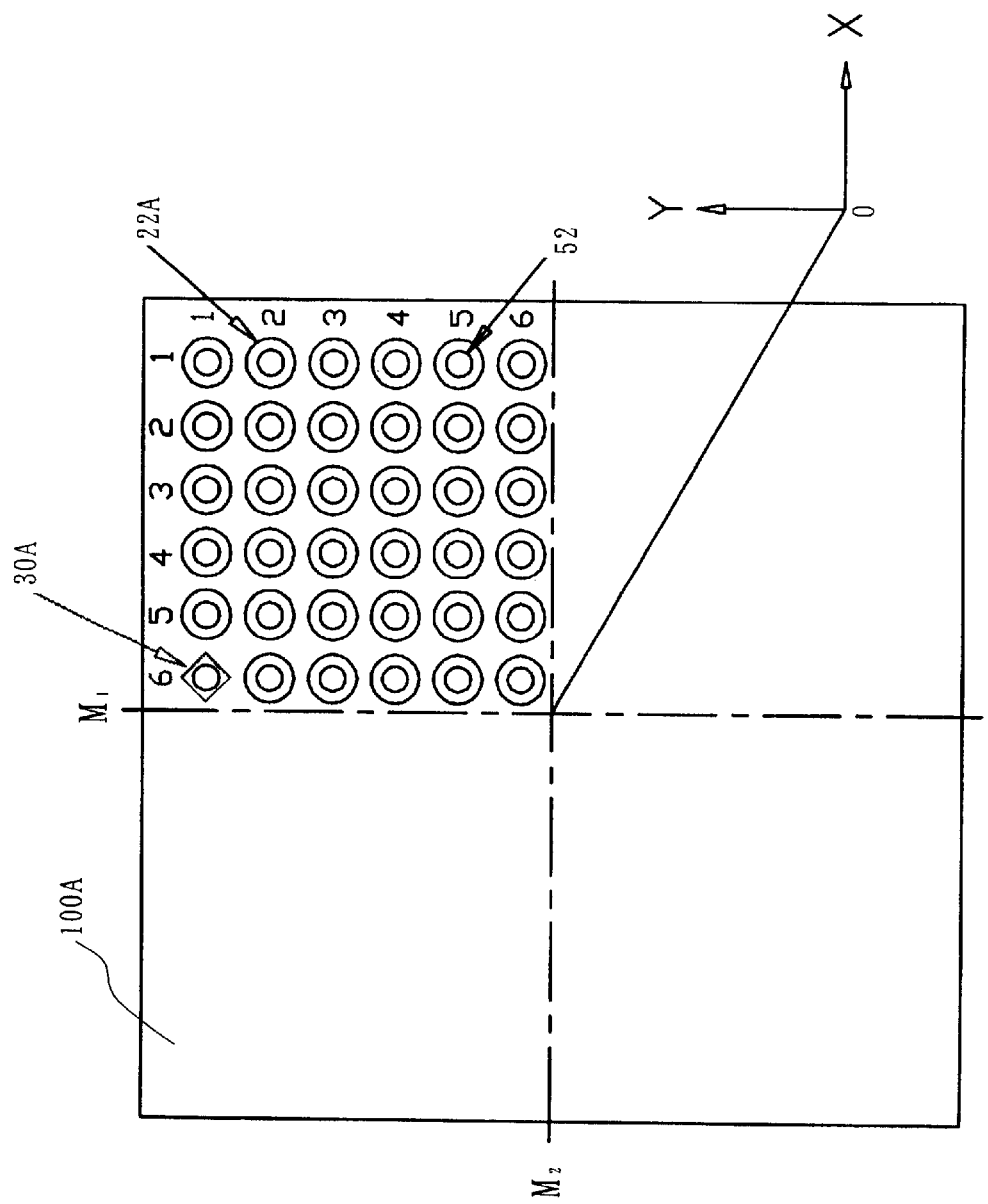
FIG. 7 is a schematic partially enlarged view of the printed-wiring board shown in FIG. 6.

Referring to FIGS. 6 and 7, a description will be given of how the printed-wiring board 100 identifies the inboard position number. The inboard position number identifies, as shown in FIG. 6, a position of the printed-wiring board 100A in a board 200 that exemplarily forms fifty-four printed-wiring boards. Here, FIG. 6 is a schematic plane view of the board 200.

Suppose that the printed-wiring boards in the board 200 are expressed by the matrix representation of nine rows times six lines starting from the uppermost and rightmost corner, and the printed-wiring board 100A is located at a position (row, line)=(6, 1). The matrix representation increases its number from the right to left and up to down from the highest and rightmost corner. This example gives a significance using numerals of 1, 2, 3, 4, . . . but may use alphabets and any other symbol. This embodiment indicates the inboard position number by combining the numerals in the row and line directions, and the inboard position number for the printed-wiring board 100A is 61.

In order to indicate such an inboard position number, the printed-wiring board shown in FIG. 7 regularly arranges pads like a matrix, as shown in its upper right quarter, and gives a significance using numerals of 1, 2, 3, 4, . . . from top to down and right to left from the uppermost and outermost pad. The printed-wiring board 100A then changes a shape of the pad 30A at the position (6, 1) from a circle to a rhomb. Here, FIG. 7 is a schematic plane view of the printed-wiring board 100A. As noted, FIG. 7 depicts only upper right quarter for illustration purposes, and the number of pads 22A is for illustrative purposes.

This embodiment sets, like FIG. 1, the X-Y coordinate with the origin O at the intersecting point between two centerlines $M_1$ and $M_2$, but uses the matrix representation with the upper right corner as an origin in the printed-wiring board 100A to point out a position of the pad 30A that identifies the inboard position number. Therefore, this embodiment uses at least two datum points, and the printed-wiring board 100A may have a plurality of origins or datum points under a certain condition. Of course, the inboard position number may be indicated using the X-Y coordinate with the origin O like the printed-wiring board 100. An orientation of the printed-wiring board 100A is prefixed by a preset orientation mark (not shown) for the origin O. Therefore, there are not plural "upper right corners" in the printed-wiring board 100A by rotating around the origin O, but there is only one "upper right corner" in the printed-wiring board 100A.

In this embodiment, the pad 30A is selected among SMD (Solder Mask Definition) pads, where the SMD pad is a pad onto which a solder mask or resist 50 is laminated. The solder mask 50 is made, for example, of transparent resin for protecting the pad, and has an opening smaller than the conductive pad to be mounted with a component in the surface conductive layer in the printed-wiring board 100A.

Figure 8:
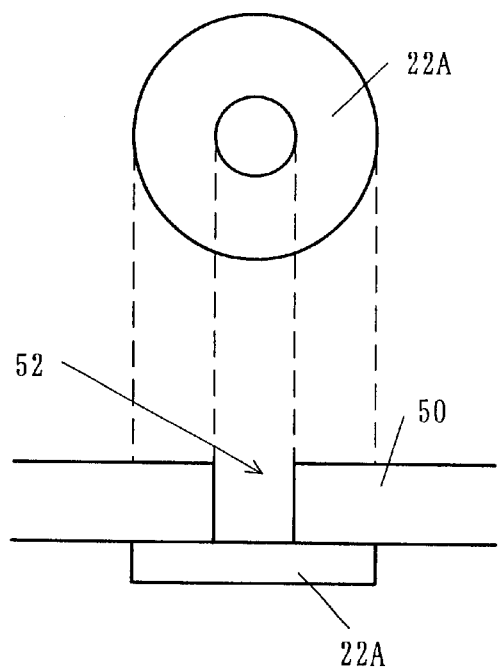
FIG. 8 is plain and partial sectional views of conductive pad in the printed-wiring board as shown in FIG. 7.

FIG. 8 shows the pad 22A in the surface conductive layer in the printed-wiring board 100A. As shown in FIG. 8, the pad 22A has a circular shape, while the solder mask 50 has the circular opening 52 and is stacked onto the pad 22A. The circle of the opening 52 is concentric to and smaller than the circle of the pad 22A. In electrically connecting the circuit element (not shown) to the pad 22A, the circuit element is connected to the surface of the pad 22A through the opening 52.

Figure 9:
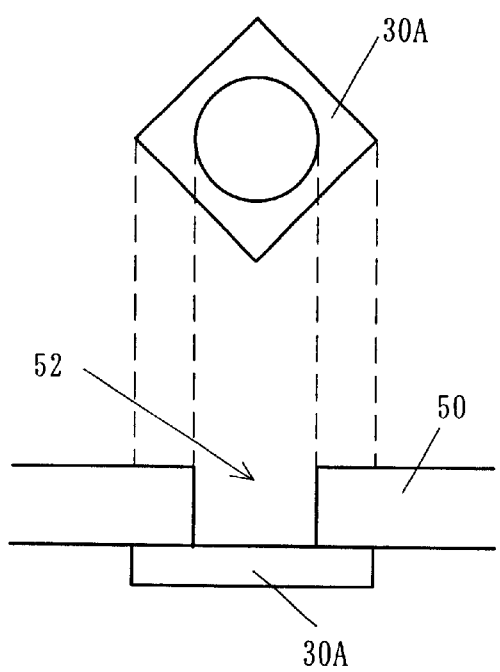
FIG. 9 is plane and partial sectional views of a pad which has a different shape from pad shown in FIG. 8.

FIG. 9 illustrates the pad 30A. The solder mask 50 similar to that shown in FIG. 8 is used for the pad 30A, and thus the size of the solder mask 50 is similar to that shown in FIG. 8. This is because the reduced size of the opening 52 cannot maintain the electric connection stable between the circuit element and the pad 30A. Therefore, the pad 30A corresponds to a changed shape of an area between the opening 52 and the pad 22A in FIG. 8. Nevertheless, when the pad 30A is provided in an area not to be mounted with the circuit element, in other words, when the pad 30A is a dummy pad, the pad 30A may use a smaller and non-circular opening 52.

Since the solder mask 50 is made of transparent material in this embodiment, the pad 30A is not recognized as the circular opening 52 but the square pad 30A is observable when viewed from the top through a transmission of the solder mask 50.

Figure 10:
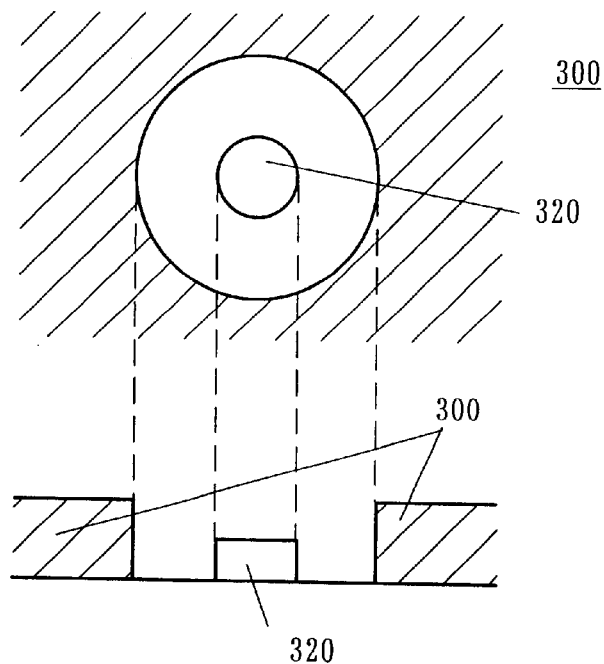
FIG. 10 is plane and partial sectional views of a different type of conductive part from the pad shown in FIG. 8.

This embodiment uses a SMD pad for the pad 30A, and the SMD pad is preferable to a NSMD or NON-SMD pad for the stable electric connection between the pad 30A and the circuit element (not shown). FIG. 10 illustrates the NSMD pad 320. The pad 320 is provided in a non-conductive part 300, and contacts the circuit element (not shown) through its entire surface. A shape and size of the pad 320 are optimally predetermined so as to keep the good electric connection, and a change of them for identification purposes would undesirably deteriorate the electric connection. On the other hand, when the pad 320 is located at the area not to be mounted with the circuit element, in other words, when the pad 320 is a dummy pad, a shape and size of the pad 320 are changeable.

Figure 11:
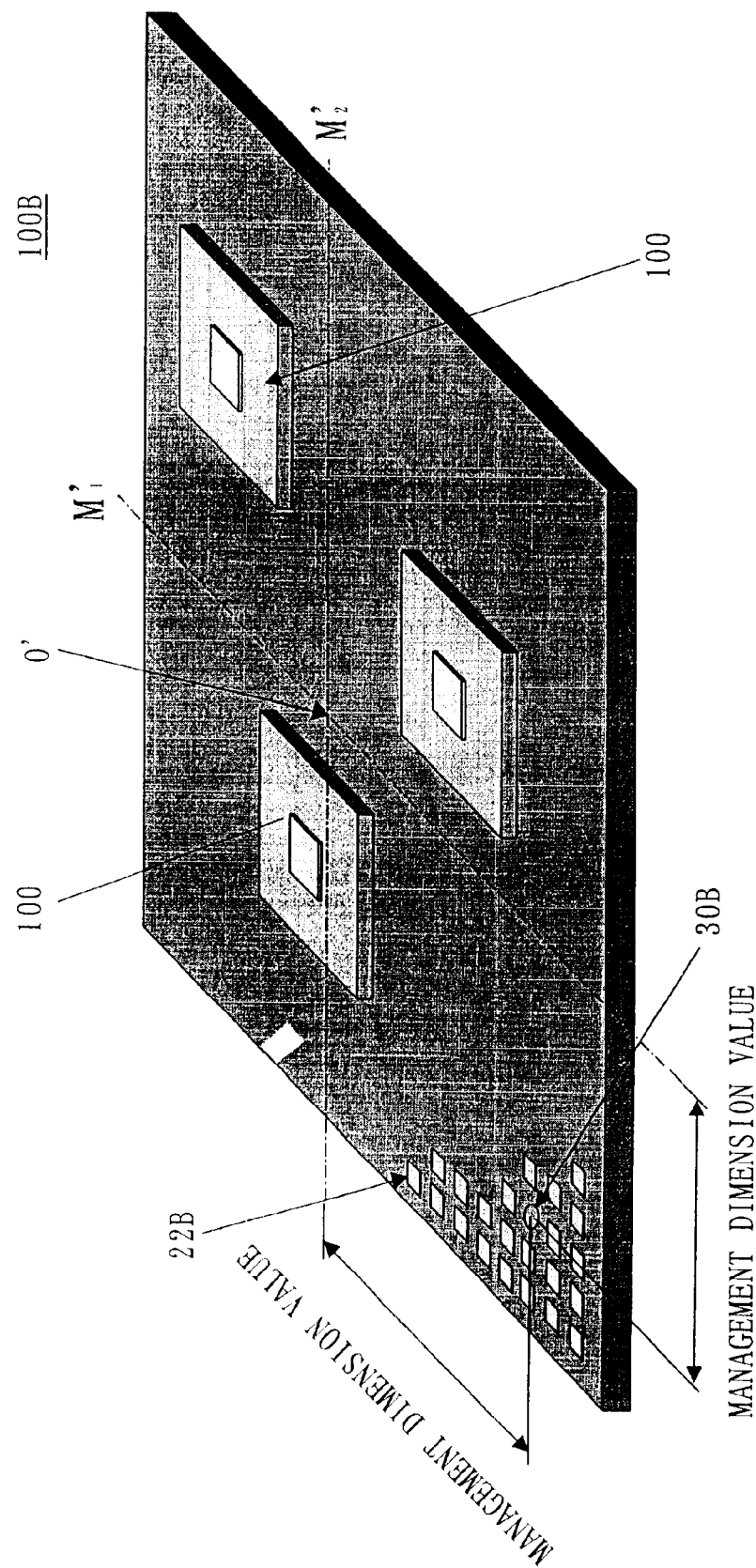
FIG. 11 is a schematic perspective view of another printed-wiring board according to the present invention.

A description will be given of another printed-wiring board 100B of the present invention, with reference to FIG. 11. Here, FIG. 11 is a schematic perspective view of the printed-wiring board 100B. The printed-wiring board 100B is implemented, for example, as a motherboard for a PC onto which a plurality of printed-wiring boards 100 are mounted. The printed-wiring board 100B has a square shape, similar to the printed-wiring board 100, and sets an X-Y coordinate with an origin O' formed at the intersecting point between centerlines $M_1'$ and $M_2'$. Pads 22B and 30B have similar functions as the pads 22 and 30, and a detailed description thereof will be omitted.

Referring to FIG. 11, it is noted that the circuit elements mounted onto the printed-wiring board 100B are plural studded printed-wiring boards 100, each of which is not located at the origin O', unlike FIG. 4. In other words, the conductive part 20, in general, does not have to center the area to be mounted with the circuit element. If necessary, the pad 30B may identify not only the printed-wiring board 100B but also a combination of the printed-wiring board 100B and its circuit element that is the printed-wiring board 100 in this embodiment.

Figure 12:
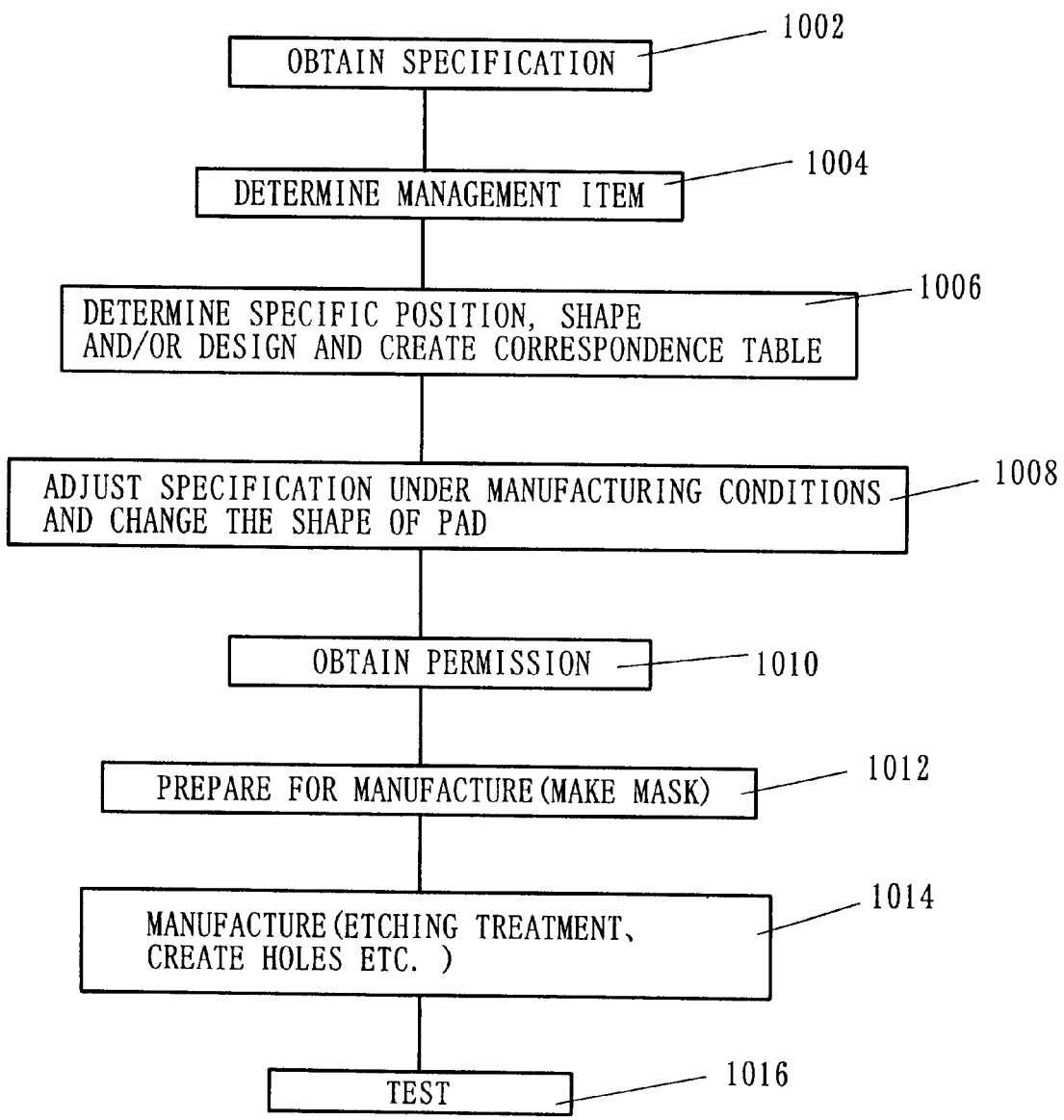
FIG. 12 is a flowchart for explaining an inventive method for manufacturing the printed-wiring board.

Next follows a description of method for manufacturing and identifying the printed-wiring board 100. With reference to FIG. 12, a description will now be given of the method for manufacturing the printed-wiring board 100 conducted by a vendor who delivers the printed-wiring board 100 to its customer. Here, FIG. 12 is a flowchart for explaining a method for manufacturing the printed-wiring board 100. First, the manufacture data as a specification of the printed-wiring board 100 that is viewable using a CAD or CAM is obtained from the customer (step 1002). The specification is determined based on a type of a circuit element to be used, and a contour size of the printed-wiring board 100, and a size, shape and arrangement of the conductive part. When the customer and the vendor are the same person, the step 1002 would become a "determination of the specification".

The management item is then determined (step 1004). In this embodiment, the management item is exemplarily the drawing number as shown in FIG. 2. Next, a specific position, shape and/or design are determined and the correspondence table between the management item and them is created (step 1006). It is determined in this step that the positional information of the pad 30 identifies the management item as shown in FIG. 1. Then, the correspondence table between the positional information as the coordinates of the pad 30 and the drawing numbers is created as shown in FIG. 2. As a consequence, the positional information is obtained corresponding to the instant management item. When the specification of the printed-wiring board 100 differs depending upon a type of electronic device, such as a cellular phone, for each customer, onto which the printed-wiring board 100 is mounted, the correspondence table shown in FIG. 2 may further correlate customer's and electronic device's identifiers.

A shape of the pad 22 corresponding to the management item is then changed using the CAD/CAM, while the specification is processed and modified into a manufacturable form (step 1008). These steps 1004 to 1008 also constitute part of the inventive method for identifying the printed-wiring board 100.

The modified data is then submitted to the customer for permission (step 1010). As discussed above, a change into the pad 30 seldom spoils the external appearance of the printed-wiring board 100; it is easy to obtain customer's permission as well as to provide the printed-wiring board 100 with an identifier. When the customer and the vendor is the same person, the step 1010 would be omitted.

A mask is then produced as a preparatory manufacturing step for the printed-wiring board 100 (step 1012). A manufacturing film is formed as a mask for forming a pattern based on permitted CAD/CAM designed data.

Plural manufacturing steps then follow, including an etching process using the mask to form the pattern (step 1014). At the same time, the pad 30 is physically formed. Holing and other processes are then conducted, and the solder mask 50 is layered this time. The etching, holing and other processes may use any method known in the art, and a description thereof will be omitted.

Lastly, the performance of the printed-wiring board 100 is tested (step 1016), and the passed products are delivered to the customer. Of course, when the customer and the vendor are the same person, the delivery would be needless.

After the printed-wiring boards 100 are delivered to the customer in accordance with the procedure shown in FIG.

Figure 13:
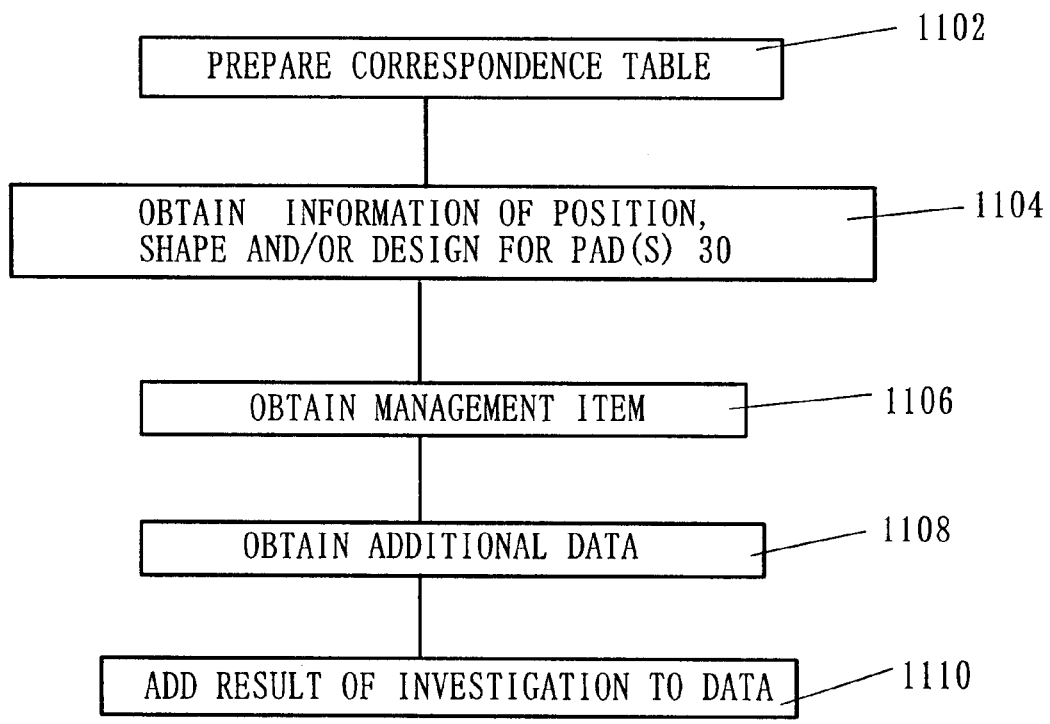
FIG. 13 is a flowchart for explaining an inventive method for identifying the printed-wiring board.

12, the customer performs an acceptance test for them and returns to the vendor those printed-wiring boards 100 which have been determined to be inferior. Referring to FIG. 13, a description will be given of the identifying method, i.e., how the vendor investigates the cause and state of the inferiority. Here, FIG. 13 is a flowchart of the identifying method according to the present invention.

First, the vendor prepares for the correspondence table shown in FIG. 2 for any returned printed-wiring boards 100 (step 1102), and then obtains the position, shape and/or design of the pad(s) 30 in each printed-wiring board 100 (step 1104). Either step 1102 or 1104 may be the first. According to this embodiment, suppose that the pad 30 is located at (X, Y)=(−17.1, −18.5), as shown in FIG. 1. The vendor who has received the returned printed-wiring board 100 locates the pad 30 through a search using a magnifier, such as a microscope. Thus, the inventive identifying method does not require any special machine as Japanese Laid-Open Patent Application No. 6-112603, although the inventive identifying method does not exclude use of an automatic reader of the ID information.

The drawing number as the management item is then obtained using the correspondence table and the detected positional information (step 1106). The correspondence table may be stored in a memory (not shown) in a PC in advance, and adapted to be part of software for automatically detecting the drawing number in response to an entry of the positional information.

The vendor may obtain additional data, such as the requested performance, date of manufacture, place of manufacture, type, shipping date, person in charge, the number of claims, causes of previous inferior portions, etc. on the basis of the obtained drawing number (step 1108). Then, in order to confirm that the printed-wiring board 100 does not meet the requested performance, the vendor may further investigate and add the investigation result to the above data while correlating it with the drawing number (step 1110).

The present invention uses various pads that have specific applications on a board to indicate the identifier and thus to manage the board, where it is difficult to maintain a physical area on the board as to put down an identifier, or where the visible numeric representation onto the board is not permitted at customer's request. Additionally and advantageously, the present invention requires no additional indication space to indicate the identifier on the board surface, and exercises no influence on the board quality.

Although the preferred embodiments of the present invention have been described above, various modifications and changes may be made in the present invention without departing from the spirit and scope thereof. For example, the present invention utilizes or makes use of a shape and/or position of a pad in a conductive part that has been originally provided to the printed-wiring board, so as to identify the printed-wiring board. These characteristics of the pad are desirable for identification purposes since they do not change with time, but the present invention allows color and other characteristics of the pad to be used.

What is claimed is:

1. A printed-wiring board to be mounted with a circuit element comprising a plurality of pads which assist in an electric connection between the circuit element and a wiring pattern, at least one of said plurality of pads being used to serve as an identifier for identifying said printed-wiring board.

2. A printed-wiring board according to claim 1, wherein said plurality of pads include:

a first pad to be mounted with the circuit element, and unobservable after the circuit element is mounted thereto; and a second pad not to be mounted with the circuit element, said identifier being determined based on a position of said second pad.

3. A printed-wiring board according to claim 1, wherein said plurality of pads include a pad having a first shape, and a pad being located at a specific position and having a second shape different from the first shape, and wherein said identifier is determined based on the specific position.

4. A printed-wiring board according to claim 1, wherein said plurality of pads include a pad having a first shape, and a pad being located at a specific position and having a second shape different from the first shape, wherein said identifier is determined based on the second shape.

5. A printed-wiring board according to claim 1, wherein said plurality of pads include a pad having a first shape, and a plurality of pads forming a specific design and each having a second shape different from the first shape, and wherein said identifier is determined based on the design.

6. A printed-wiring board according to claim 1, wherein said identifier identifies at least one piece of identification information including a drawing number that instructs a design drawing of said printed-wiring board, an inboard position number that instructs a position in a board at which said printed-wiring board is taken out, a country of production of said printed-wiring board, a manufacturer of said printed-wiring board, a size of said printed-wiring board, a version of said printed-wiring board, the number of layers in said printed-wiring board, a name of said printed-wiring board, and a date of manufacture of said printed-wiring board.

7. A printed-wiring board according to claim 1, wherein a contour of said at least one of said plurality of pads is larger than an area in which the circuit element contacts another pad.

8. A printed-wiring board according to claim 1, wherein said at least one of said plurality of pads are provided with and protected by a protective mask that has an opening smaller than a contour of said at least one of said plurality of pads, through which opening the circuit element is electrically connectible to said at least one of said plurality of pads.

9. A printed-wiring board according to claim 1, said at least one of said plurality of pads and the rest of said plurality of pads respectively have different shapes, which are selected from a circle, a rectangle, a pentagon, a hexagon, an octagon, and a cross.

10. A method for identifying a printed-wiring board including a plurality of pads adapted to assist in an electrical connection between a wiring pattern and an electronic element mounted onto said printed-wiring board, said method comprising the steps of:

selecting a specific position among said plurality of pads in the printed-wiring board; and setting the pad located at the specific position to a shape different from another pad at another position.

11. A method according to claim 10, wherein said plurality of pads include a first pad to be mounted with the circuit element and unobservable after the circuit element is mounted thereto, and a second pad not to be mounted with the circuit element, wherein said selecting step selects the specific position from the second pad.

12. A method according to claim 10, wherein said selecting step selects the specific position from a pad provided with and protected by a protective mask that has an opening smaller than a contour of the pad provided with the protective mask, through which opening the circuit element is electrically connectible to the pad located at the specific position.

13. A method for identifying a printed-wiring board including a plurality of pads adapted to assist in an electrical connection between a wiring pattern and an electronic element mounted onto said printed-wiring board, said method comprising the steps of:

setting a design for identifying said printed-wiring board; and assigning the design to at least one of said plurality of pads and setting at least one of said plurality of pads to a different shape from another pad located at another position.

14. A method according to claim 13, wherein said plurality of pads include a plurality of first pads to be mounted with the circuit element and unobservable after the circuit element is mounted thereto, and a plurality of second pads not to be mounted with the circuit element, wherein said assigning and setting step assigns the design to the second pads.

15. A method according to claim 13, wherein said assigning and setting step assigns the design to pads each provided with and protected by a protective mask that has an opening smaller than a contour of the pad provided with the protective mask, through which opening the circuit element is electrically connectible to the pad.

16. A method for identifying a printed-wiring board including a plurality of pads adapted to assist in an electrical connection between a wiring pattern and an electronic element mounted onto said printed-wiring board, said plurality of pads including a pad having a first shape and a pad being located at a specific position and having a second shape different from the first shape, said method comprising the steps of:

obtaining information of the specific position in the printed-wiring board; and identifying a management item for the printed-wiring board by referring to a table that has been prepared in advance and correlates the information with the management item.

17. A method for identifying a printed-wiring board including a plurality of pads adapted to assist in an electrical connection between a wiring pattern and an electronic element mounted onto said printed-wiring board, said plurality of pads including a pad having a first shape and a pad being located at a specific position and having a second shape different from the first shape, said method comprising the steps of:

obtaining information of the second shape in the printed-wiring board; and identifying a management item for the printed-wiring board by referring to a table that has been prepared in advance and correlates the information with the management item.

18. A method for manufacturing an identifiable printed-wiring board including a plurality of pads adapted to assist in an electrical connection between a wiring pattern and an electronic element mounted onto said printed-wiring board, said method comprising the steps of:

setting a pad at a specific position in said plurality of pads to a specific shape different from another pad at another position so as to identify the printed-wiring board; and making said plurality of pads through an etching process.

19. A print board module comprising:

a circuit element electrically connectible to a wiring pattern; and a printed-wiring board mounted with said circuit element, wherein said printed-wiring board uses as an identifier for identifying said printed-wiring board a pad which assists in an electric connection between said circuit element and the wiring pattern.

20. An electronic device comprising a print board module including a circuit element electrically connectible to a wiring pattern, and a printed-wiring board mounted with said circuit element, wherein said printed-wiring board uses as an identifier for identifying said printed-wiring board a pad which assists in an electric connection between said circuit element and the wiring pattern.

* * * * *